(12) United States Patent
Tsubono

(10) Patent No.: US 7,924,571 B2
(45) Date of Patent: Apr. 12, 2011

(54) CIRCUIT MODULE

(75) Inventor: Masanori Tsubono, Machida (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/561,318

(22) Filed: Sep. 17, 2009

(65) Prior Publication Data

US 2010/0079963 A1 Apr. 1, 2010

(30) Foreign Application Priority Data

Sep. 29, 2008 (JP) ................................. 2008-250783

(51) Int. Cl.
*H05K 5/00* (2006.01)
(52) U.S. Cl. .................... 361/752; 361/730; 361/801
(58) Field of Classification Search .................. 361/752, 361/800, 730, 790, 797, 816, 818, 801–803; 312/223.1, 223.2
See application file for complete search history.

(56) References Cited

U.S. PATENT DOCUMENTS

| | | | | |
|---|---|---|---|---|
| 5,883,791 A | * | 3/1999 | Deguchi | 361/818 |
| 5,907,478 A | * | 5/1999 | Watanabe | 361/807 |
| 6,011,700 A | * | 1/2000 | Matsuzaki | 361/816 |
| 6,144,557 A | * | 11/2000 | Chen et al. | 361/704 |
| 6,301,125 B1 | * | 10/2001 | Maeda | 361/818 |
| 6,491,528 B1 | * | 12/2002 | McLean | 439/76.1 |

FOREIGN PATENT DOCUMENTS

| | | |
|---|---|---|
| JP | 61-013691 A | 1/1986 |
| JP | 05-018096 U | 3/1993 |
| JP | 2003-060376 A | 2/2003 |

* cited by examiner

*Primary Examiner* — Hung S Bui

(74) *Attorney, Agent, or Firm* — Keating & Bennett, LLP

(57) ABSTRACT

A shield case shields an electric circuit on a circuit board by covering a front surface and a side peripheral surface of the circuit board. The shield case includes a frame section vertically arranged on a mother board and covering the side peripheral surface of the circuit board, and a lid section including a plate member provided at an upper end of the frame section and covering the front surface of the circuit board. The circuit board is arranged in the frame section at a position spaced apart from a front surface of the mother board, and has a circuit-side connector at a back surface of the circuit board. The circuit-side connector is connected with a mother-board-side connector provided at the mother board, so that an electric circuit of the circuit board is electrically connected with a conductive portion of the mother board.

3 Claims, 7 Drawing Sheets

CIRCUIT MODULE

BACKGROUND OF THE INVENTION

1. Field of the Invention

The present invention relates to a circuit module which includes a circuit board having, for example, an electric circuit, and which is applied to an electronic device, etc.

2. Description of the Related Art

FIG. 5A is an exploded perspective view schematically showing an example of a circuit module. As shown in FIG. 5A, a circuit module 31 includes a circuit board 3 and a shield case 35. The circuit board 3 has an electronic component 30 mounted on a front surface of a board, thereby forming an electric circuit. The shield case 35 shields the electric circuit of the circuit board 3 by covering a front surface and a side peripheral surface of the circuit board 3. The shield case 35 includes a frame section 32 covering the side peripheral surface of the circuit board 3, and a lid section 34 covering the front surface of the circuit board 3.

The circuit board 3 is arranged in an opening 32a of the frame section 32. In this state, the lid section 34 is provided above the front surface of the circuit board 3 to close the opening 32a at an upper side of the frame section 32. Hence, the lid section 34 covers the front surface of the circuit board 3. FIG. 5B is a plan view schematically showing a positional relationship between the circuit board 3 and the frame section 32. As shown in FIG. 5B, a predetermined clearance (gap due to variation of tolerance) m is provided between an inner wall of the frame section 32 and an outer peripheral surface of the circuit board 3, for smoothly carrying out arrangement of the circuit board 3 into the frame section 32. In the example shown in FIG. 5A, a support portion 40 is provided in the frame section 32. The support portion 40 supports the circuit board 3 from a lower side. The support portion 40 has a height smaller than a height of the frame section 32. The circuit board 3 is arranged in the frame section 32 while being supported by the support portion 40. The circuit board 3 is arranged at a position spaced apart from a front surface of a mother board 12.

Referring to FIGS. 6A and 6B, the circuit module 31 is mounted on the mother board 12 when being used. The frame section 32 is vertically arranged on the mother board 12. For example, an attachment portion 36 protruding from a lower end of the frame section 32 is inserted into a hole 37 formed in the mother board 12, and is fixed to the mother board 12 by soldering, etc. Alternatively, referring to FIG. 6B, attachment portions 38 and 41 protrude outward from the frame section 32. The attachment portion 38 is fixed to the mother board 12 via solder 39. Also, the attachment portion 41 is fixed to the mother board 12 by a screw 43 inserted into screw holes 42 and 44.

Also, a pin terminal (not shown) protrudes from a back surface of the circuit board 3. The pin terminal is inserted into a through hole formed in the mother board 12 and is soldered at a back surface of the mother board 12. Accordingly, the electric circuit of the circuit board 3 is electrically connected with a circuit of the mother board 12 (for example, see Japanese Unexamined Patent Application Publication No. 61-13691, Japanese Unexamined Utility Model Registration Application Publication No. 5-18096, and Japanese Unexamined Patent Application Publication No. 2003-60376).

It is desirable to easily connect the circuit module with the mother board 12 by a fewer number of steps. If the circuit module 31 is electrically connected with the mother board 12 by inserting the pin terminal provided at the circuit board 3 into the hole of the mother board 12 and soldering the pin terminal, such connection is troublesome work, resulting in a low working efficiency. Thus, a product formed by arranging the circuit module 31 on the mother board 12 may be increased in cost.

SUMMARY OF THE INVENTION

In view of such problems, preferred embodiments of the present invention provide a circuit module that is adapted to be easily electrically connected with a mother board.

According to a preferred embodiment of the present invention, a circuit module includes a circuit board with an electric circuit located on a front surface of the circuit board; and a shield case arranged to shield the electric circuit of the circuit board by covering the front surface and a side peripheral surface of the circuit board. The shield case includes a frame section vertically arranged on a mother board and covering the side peripheral surface of the circuit board, and a lid section including a plate member provided at an upper end of the frame section and covering the front surface of the circuit board. The circuit board is arranged in the frame section at a position apart from a front surface of the mother board. The circuit board has a circuit-side connector at a back surface of the circuit board, the circuit-side connector being connected with a mother-board-side connector provided at the mother board such that the electric circuit of the circuit board is electrically connected with a conductive portion of the mother board.

In the circuit module of the present preferred embodiment, the electric circuit of the circuit board is shielded because the shield case covers the surface and the side peripheral surface of the circuit board. In this state, the circuit module is arranged on the mother board. The circuit board is arranged in the frame section of the shield case at the position spaced apart from the front surface of the mother board. The circuit-side connector provided at the back surface of the circuit board is connected with the mother-board-side connector provided at the mother board. Accordingly, the electric circuit of the circuit board can be electrically connected with the conductive portion of the mother board by an extremely easy operation.

That is, the circuit module of the present preferred embodiment eliminates the necessity of a soldering process which has been required for the configuration of the related art in which the circuit board is connected with the mother board by soldering. Thus, man-hours required for attaching the circuit module to the mother board can be reduced. In addition, the circuit-side connector can be connected with the mother-board-side connector by a single quick operation. Hence, the connection work efficiency for the circuit module and the mother board can be markedly increased. As a result, a product formed by arranging the circuit module on the mother board can be prevented from being increased in cost.

In addition, in the present preferred embodiment, unlike the related art, a pin terminal provided at a circuit terminal is not inserted into a hole of a mother board. Hence, it is not necessary to make a hole in the mother board. A wide area of the mother board can be used for design, thereby increasing the degree of freedom of design. In addition, in the present preferred embodiment, by applying a connector with a small pitch to the circuit-side connector (in this case, the mother-board-side connector connected with the circuit-side connector is also a connector with a small pitch), a wider area of the mother board can be used for design.

In the present preferred embodiment, since the circuit-side connector provided at the back surface of the circuit board is connected with the mother-board-side connector provided at the mother board as described above, if relative positions of the frame section and the circuit board vary, a stress from the circuit-side connector may remain at the circuit board after the circuit module is attached to the mother board.

In the present preferred embodiment, the circuit-side connector may be provided at a position near one end of the circuit board. The circuit board may have a positioning protrusion arranged to position the circuit board with respect to the frame section, the positioning protrusion protruding outward from an end surface of the circuit board at a position near the circuit-side connector. The frame section may have a positioning hole into which the positioning protrusion is fitted when the circuit board is housed in the frame section. The circuit board can be correctly positioned with respect to the frame section by inserting and fitting the positioning protrusion into the positioning hole. Thus, generation of a residual stress can be prevented.

The shield case is typically formed of metal. The metal is processed by press-bending and blanking. The dimensional tolerance of press-bending is narrow as compared with blanking (low dimensional accuracy). For example, a general dimensional tolerance for blanking requires about ±0.03-0.05 mm. In contrast, a general dimensional tolerance for bending requires about ±0.1-0.15 mm. In the present preferred embodiment, in the case where the frame section has the positioning hole, the positioning hole can be accurately formed by blanking. Accordingly, by inserting the positioning protrusion of the circuit board into the positioning hole, the circuit board can be correctly positioned with respect to the frame section.

Further, in the present preferred embodiment, the lid section of the shield case may have a bent portion formed by bending a portion of the plate member of the lid section downward, the bent portion being formed in a region of the lid section covering the circuit-side connector, the bent portion pressing the circuit board downward at a position near the circuit-side connector and preventing the circuit board from being lifted upward when the circuit-side connector is connected with the mother-board-side connector. Thus, with the configuration, the circuit board can be prevented from being lifted upward, from being warped upward, and from being distorted. The circuit board can be further correctly connected with the mother board.

Furthermore, in the present preferred embodiment, the circuit board may have a positioning protrusion at an end surface of the circuit board. The frame section may have a positioning hole into which the positioning protrusion is fitted. The lid section of the shield case may have a bent portion formed by bending a portion of the plate member of the lid section downward. With this configuration, the circuit board can be prevented from being lifted upward. The circuit board can be further correctly connected with the mother board. In addition, the frame section may have a protrusion protruding upward from the upper end of the frame section at a position above the positioning hole. The lid section may have a recess at the position of the bent portion. Hence, the protrusion at the upper end of the frame section can be fitted into the recess, and the lid section can be arranged at the upper end of the frame section in a correct direction. Accordingly, the circuit module can be fabricated correctly and efficiently.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will be described below with reference to the drawings. In the description of the preferred embodiments, redundant description for components similar to those of related art will be omitted or merely briefly provided.

Figure 1A:
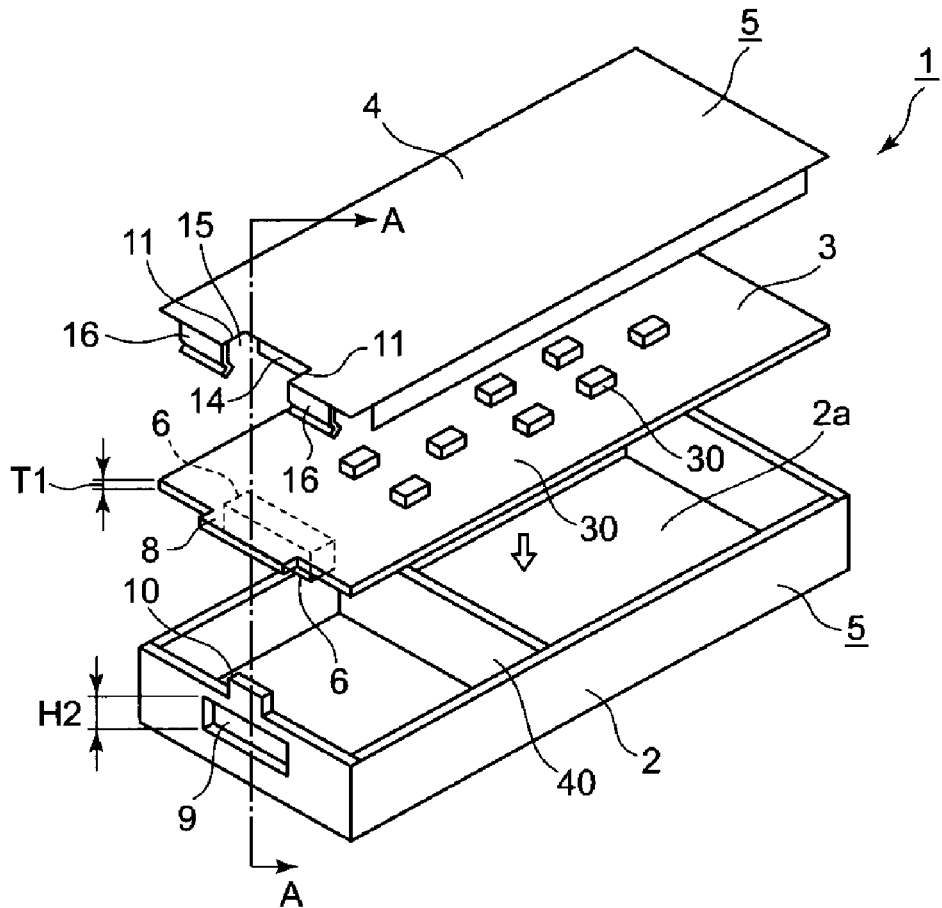
FIGS. 1A and 1B each illustrate a circuit module according to a preferred embodiment of the present invention.
Figure 1B:
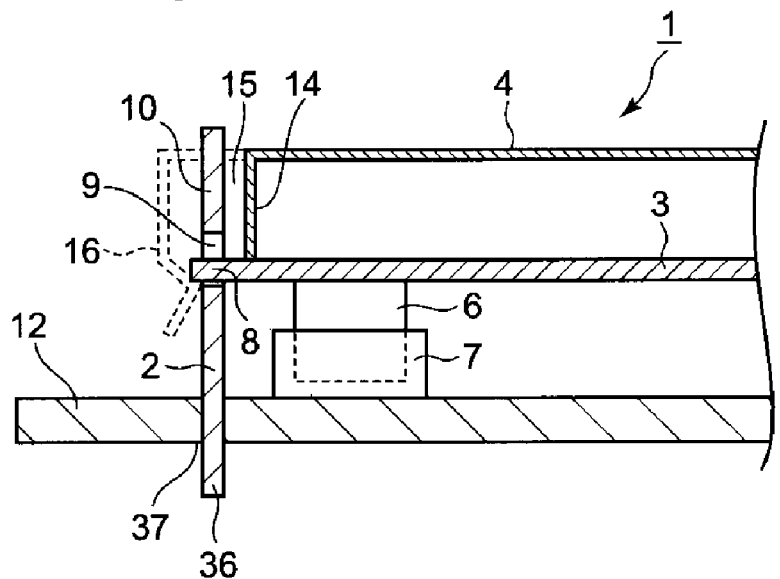
Figure 5A:
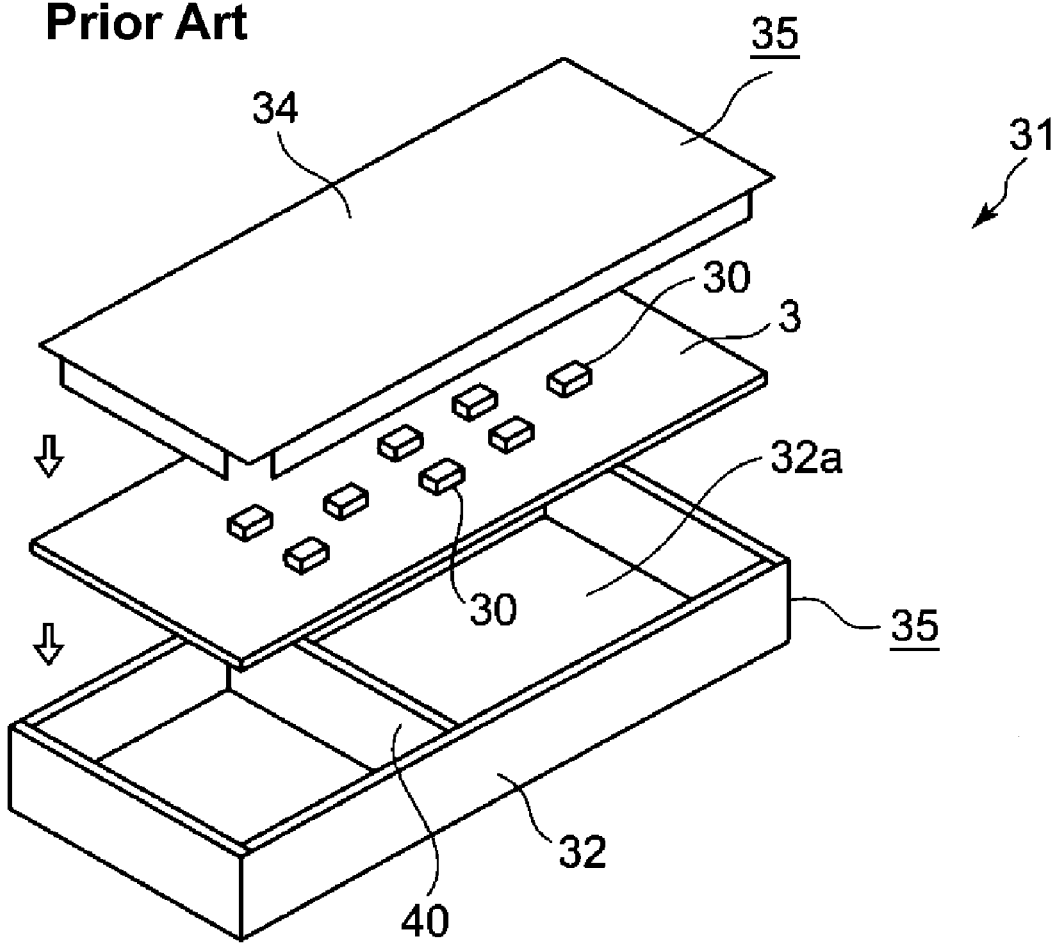
FIGS. 5A and 5B are explanatory views each showing an example of a circuit module of related art.
Figure 5B:
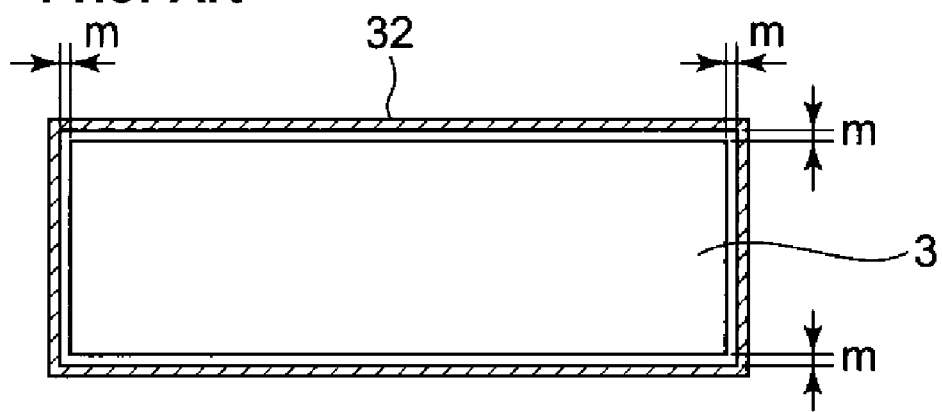
Figure 6A:
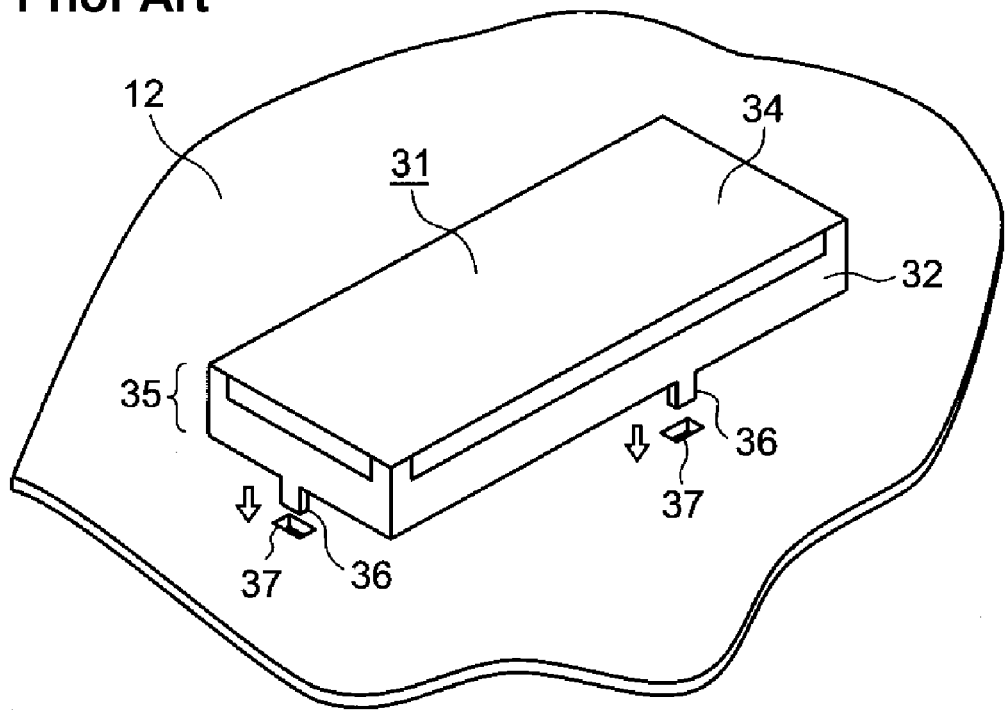
FIGS. 6A and 6B are explanatory views each showing an example attachment structure of the circuit module to a mother board shown in FIGS. 5A and 5B.
Figure 6B:
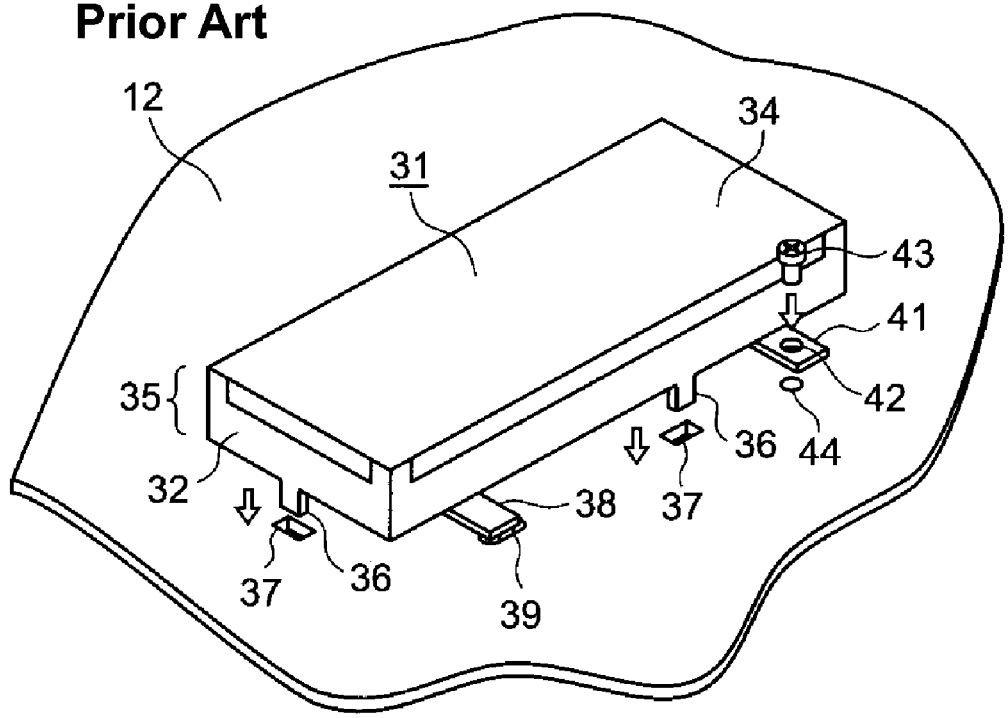

FIG. 1A is an exploded perspective view schematically showing a circuit module according to a preferred embodiment of the present invention. FIG. 1B is a cross-sectional view of the circuit module taken along line A-A in FIG. 1A. A circuit module 1 of this preferred embodiment is somewhat similar to the circuit module 31 shown in FIG. 5A. A circuit board 3 is housed in a shield case 5. The shield case 5 includes a frame section 2 and a lid section 4. In this preferred embodiment, an attachment structure of the frame section 2 to a mother board 12 is somewhat similar to that of related art. While FIG. 1B illustrates an attachment portion 36 used for attachment and a hole 37 formed in the mother board 12, FIG. 1A does not illustrate these components.

This preferred embodiment features that a circuit-side connector 6 is provided at a back surface of the circuit board 3 arranged in the frame section 2. The circuit-side connector 6 is a connector which electrically connects an electric circuit of the circuit board 3 with a conductive portion of the mother board 12 when the circuit-side connector 6 is connected with a mother-board-side connector 7 provided at the mother board 12. The circuit-side connector 6 can be connected by a single quick operation of fitting the circuit-side connector 6 to the mother-board-side connector 7.

The circuit-side connector 6 is provided at a position near one end of the circuit board 3. The circuit board 3 has a positioning protrusion 8 arranged to position the circuit board 3 with respect to the frame section 2. The positioning protrusion 8 protrudes outward (leftward in FIG. 1A) from an end surface at a position near the circuit-side connector 6 (that is, a left end surface of the circuit board 3 in FIG. 1A). The positioning protrusion 8 has a substantially rectangular shape, whose width is smaller than an external width of the circuit board 3. The positioning protrusion 8 can have a high dimensional accuracy in a width direction. Assuming that Y is the width of the positioning protrusion 8, Y can be about Y±0.05 mm, for example.

The frame section 2 has a positioning hole 9 to which the positioning protrusion 8 is fitted when the circuit board 3 is housed in the frame section 2. The frame section 2 also has a protrusion 10 protruding upward from an upper end of the frame section 2 at a position above the position of the positioning hole 9. The positioning hole 9 is a substantially rectangular through hole. The positioning hole 9 is formed by blanking a pressed metal portion. By this processing, assuming that X is a width of the positioning hole 9, the positioning hole 9 can have a high dimensional accuracy for the width such as about X±0.05 mm or smaller, for example.

Figure 3:
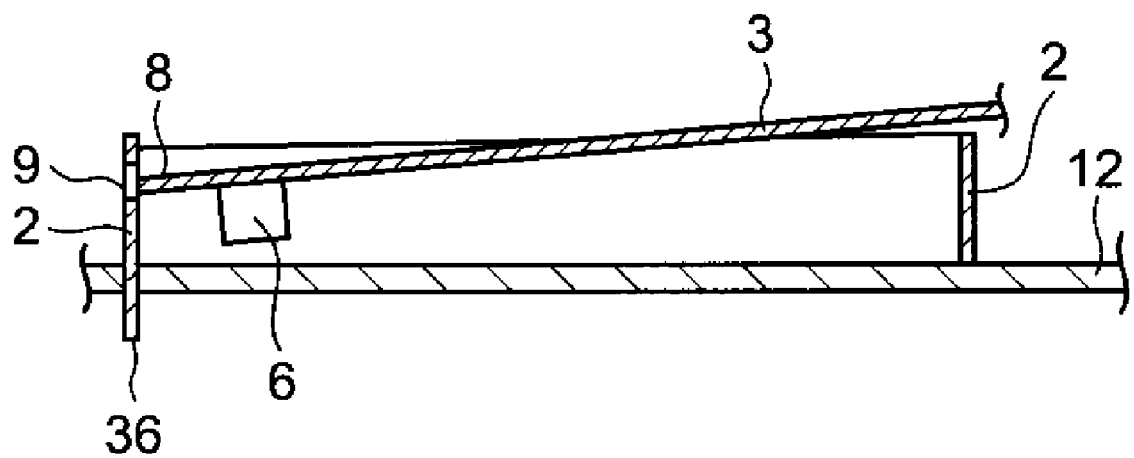
FIG. 3 is an explanatory view showing a housing structure of a circuit board into the frame section of the circuit module according to a preferred embodiment of the present invention.

When the positioning protrusion 8 of the circuit board 3 is fitted into the positioning hole 9, the circuit board 3 is inserted in an inclined manner as shown in FIG. 3 to prevent an end surface of the circuit board 3 from interfering with an inner wall surface of the frame section 2. As a result, the positioning hole 9 may have a sufficient height (H2) with respect to a thickness (T1) of the circuit board 3, to provide a sufficient clearance. With the clearance, the circuit board 3 can be easily inserted. In FIG. 3, the support portion 40 is not illustrated.

In this preferred embodiment, as described above, the positioning protrusion 8 is fitted into the positioning hole 9 as described above, and the circuit board 3 is positioned with respect to the frame section 2 and housed therein. Herein, to achieve fitting of the positioning protrusion 8 into the positioning hole 9, it is only necessary that X−0.05 mm>Y+0.05 mm, in view of the dimensional accuracy of the width of the positioning protrusion 8 and the dimensional accuracy of the width of the positioning hole 9. Hence, a maximum positional shift in the width direction between the circuit board 3 and the frame section 2 is about ±0.1 mm, for example. The positional shift is about ±0.2 mm in related art. Therefore, in this preferred embodiment, the circuit board 3 can be housed in the frame section 2 with almost no positional shift (with a positional shift which is about half the positional shift of related art).

Figure 7:
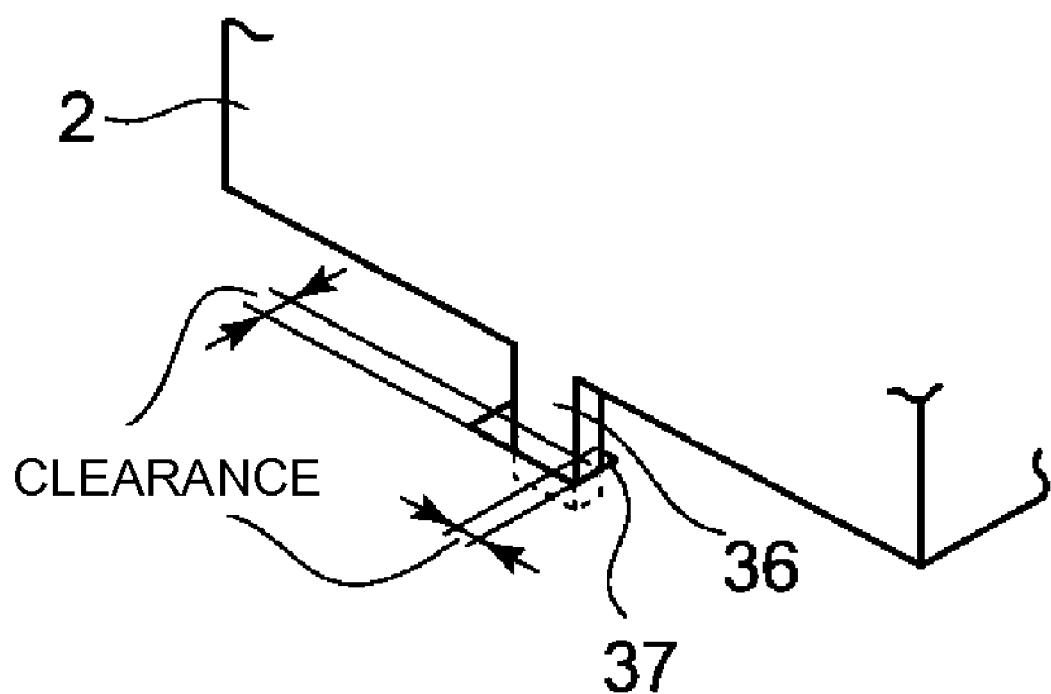
FIG. 7 is an explanatory view showing an example attachment structure when the circuit module is mounted on the mother board.

When a positional shift between the circuit board 3 and the frame section 2 is large, a stress may remain at the circuit-side connector 6 after the circuit-side connector 6 is connected to the mother-board-side connector 7. Hence, a residual stress may be applied to the circuit board 3. To avoid this, referring to FIG. 7, it is necessary to increase the clearance between the attachment portion 36 of the frame section 2 and the hole 37 of the mother board 12. If the clearance is increased, the circuit board 3 moves in the frame section 2, resulting in that it is difficult to fit the circuit-side connector 6 into the motherboard-side connector 7, and that a vibration shock is likely applied to the attachment portion 36 when a product formed by attaching the circuit module 1 to the mother board 12 is mounted on a vehicle. In contrast, in this preferred embodiment in which the positional shift between the circuit board 3 and the frame section 2 is small, the clearance between the attachment portion 36 and the hole 37 need not be increased. Hence, such a problem can be avoided.

The lid section 4 of the shield case 5 has a cut portion 11 in a region covering the circuit-side connector 6, to allow a portion of a plate member of the lid section 4 to be bent downward. The portion of the plate member of the lid section 4 is bent downward at the position of the cut portion 11, thereby forming a bent portion 14. When the circuit-side connector 6 is connected with the mother-board-side connector 7, the bent portion 14 presses the circuit board 3 downward at a position near the circuit-side connector 6. Thus, the bent portion 14 prevents the circuit board 3 from being lifted upward.

Figure 2:
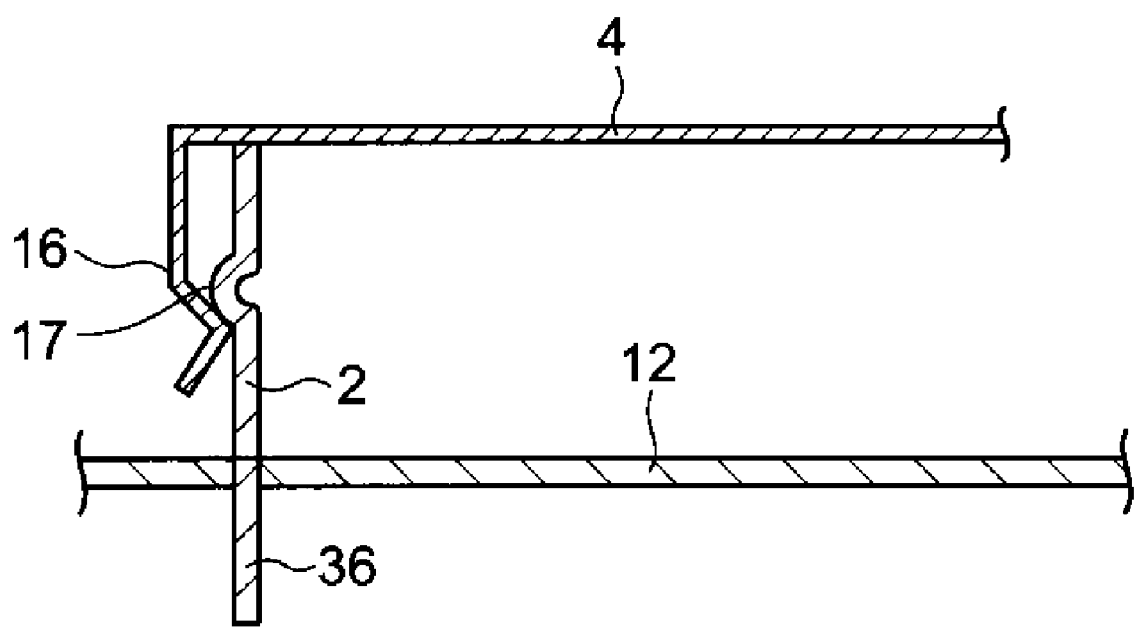
FIG. 2 is an explanatory view showing a fitting structure of a lid section to a frame section of the circuit module according to a preferred embodiment of the present invention.

In addition, the lid section 4 has a recess 15 formed at the position of the bent portion 14 in a portion of an end surface of the lid section 4. Referring to FIG. 1A, the protrusion 10 at the upper end of the frame section 2 is fitted into the recess 15, and hence, the lid section 4 is arranged at the upper end of the frame section 2 in a correct direction (thereby preventing the lid section 4 from being inversely attached). Referring to FIG. 1A, hook structure portions 16 are provided at an end of the lid section 4 at both sides of the recess 15. The hook structure portions 16 engage with lock portions 17 of the frame section 2 as shown in FIG. 2. Accordingly, the lid section 4 can be detachably attached to the frame section 2. In FIG. 1A, the lock portions 17 are not illustrated.

As described above, the circuit module of this preferred embodiment is configured such that the circuit board 3 can be housed in the shield case 5 while the circuit board 3 is correctly positioned with respect to the shield case 5, and that the circuit board 3 can be extremely easily and correctly connected with the mother board 12, thereby providing high reliability.

The present invention is not limited to the above-described preferred embodiment, and various modifications can be provided. For example, in the above-described preferred embodiment, while the protrusion 10 at the upper end of the frame section 2 is fitted into the recess 15 formed at the end of the lid section 4 of the shield case 5, for example, the protrusion 10 may not be provided, and the fitting structure between the protrusion 10 and the recess 15 may be omitted. In this case, for example, a mark may be provided by printing or the like to prevent the lid section 4 from being inversely attached to the frame section 2. However, a worker may incorrectly recognize the mark when the worker attaches the lid section 4 to the frame section 2. Since the preferred embodiment has the configuration which physically inhibits the lid section 4 from being inversely attached to the frame section 2, the inverse attachment can be reliably prevented.

Also, in a preferred embodiment, while the bent portion 14 is formed at the end of the lid section 4 of the shield case 5, the bent portion 14 is only required to be formed at a position near the circuit-side connector 6 provided at the one end of the circuit board 3. If the protrusion 10 is not provided at the frame section 2, the bent portion 14 may be formed at an inner side with respect to the end of the lid section 4.

Figure 4A:
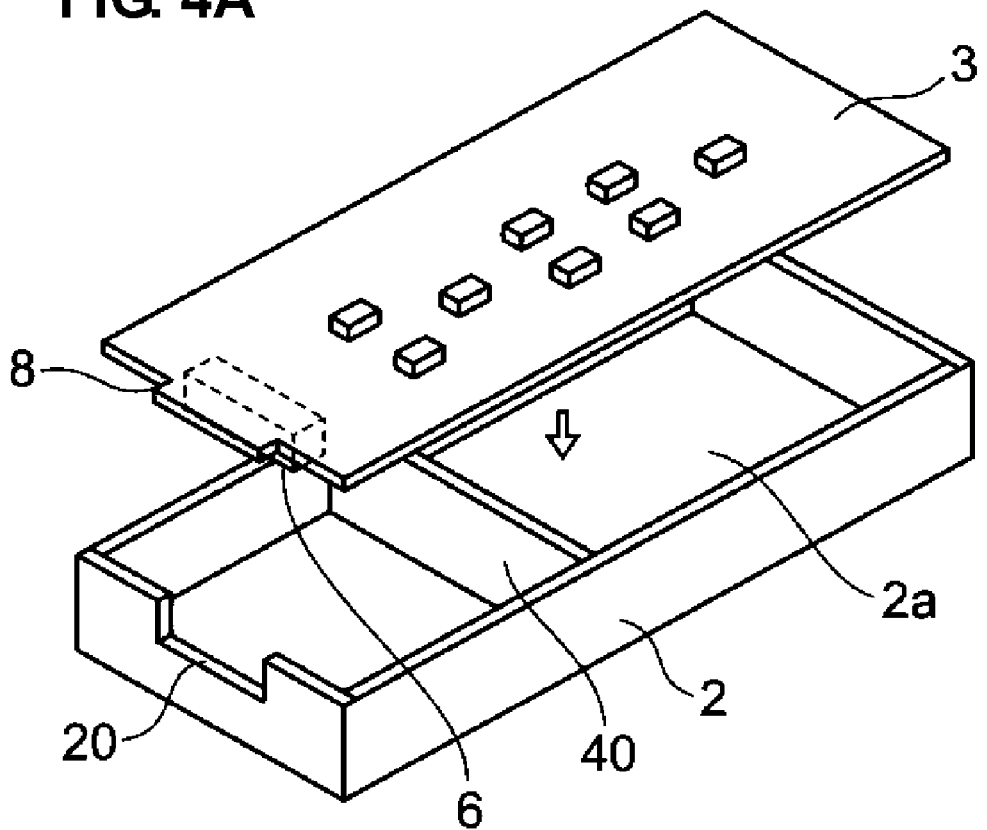
FIGS. 4A and 4B are explanatory views each showing a circuit board and a frame section of a circuit module according to another preferred embodiment of the present invention.
Figure 4B:
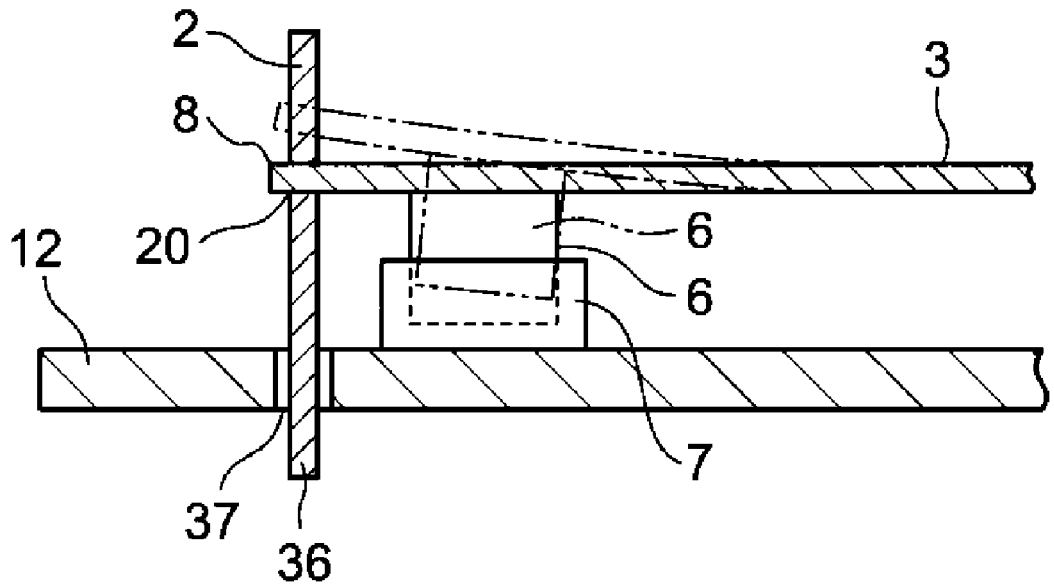

Further, in a preferred embodiment, while the frame section 2 has the positioning hole 9, referring to FIG. 4A, an opening (cut portion) 20 may be provided at the upper opening instead of the positioning hole 9, so that the positioning protrusion 8 of the circuit board 3 is fitted into the opening 20. In this case, however, the intensity of the frame section 2 may be decreased. Also, referring to FIG. 4B, when the circuit-side connector 6 is connected with the mother-board-side connector 7, the circuit board 3 may receive a force to an upper side. The force may cause the circuit board 3 to be bent and an electronic component of the electric circuit may be broken. Therefore, after the positioning protrusion 8 of the circuit board 3 is inserted into the opening 20, for example, soldering has to be carried out. Hence, the frame section 2 desirably has the positioning hole 9 like the preferred embodiment described above.

Furthermore, the external shape of the shield case 5, and the external shape and circuit structure of the circuit board 3 are not particularly limited, and may be set as desired. The circuit-side connector 6 is provided at the back surface of the circuit board 3, which is housed in the frame section 2 of the shield case 5 at a position apart from the mother board 12, and the circuit-side connector 6 is connected with the mother-board-side connector 7. Accordingly, the circuit module which can be easily connected with the mother board 12 can be formed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module, comprising:
a circuit board including an electric circuit located on a front surface of the circuit board; and
a shield case arranged to shield the electric circuit of the circuit board by covering the front surface and a side peripheral surface of the circuit board; wherein
the shield case includes:
a frame section vertically arranged on a mother board and covering the side peripheral surface of the circuit board; and
a lid section including a plate member provided at an upper end of the frame section and covering the front surface of the circuit board; wherein
the circuit board is arranged in the frame section at a position spaced apart from a front surface of the mother board;
the circuit board has a circuit-side connector at a back surface of the circuit board, the circuit-side connector being connected with a mother-board-side connector provided at the mother board such that the electric circuit of the circuit board is electrically connected with a conductive portion of the mother board;
the circuit-side connector is located at a position near one end of the circuit board;
the circuit board has a positioning protrusion arranged to position the circuit board with respect to the frame section, the positioning protrusion protruding outward from an end surface of the circuit board at a position near the circuit-side connector; and
the frame section has a positioning hole into which the positioning protrusion is fitted when the circuit board is housed in the frame section.

2. A circuit module, comprising:
a circuit board including an electric circuit located on a front surface of the circuit board; and
a shield case arranged to shield the electric circuit of the circuit board by covering the front surface and a side peripheral surface of the circuit board; wherein
the shield case includes:
a frame section vertically arranged on a mother board and covering the side peripheral surface of the circuit board; and
a lid section including a plate member provided at an upper end of the frame section and covering the front surface of the circuit board; wherein
the circuit board is arranged in the frame section at a position spaced apart from a front surface of the mother board;
the circuit board has a circuit-side connector at a back surface of the circuit board, the circuit-side connector being connected with a mother-board-side connector provided at the mother board such that the electric circuit of the circuit board is electrically connected with a conductive portion of the mother board;
the lid section of the shield case has a cut portion arranged to allow a portion of the plate member of the lid section to be bent downward, the cut portion being provided in a region of the lid section covering the circuit-side connector; and
the portion of the plate member of the lid section is bent downward at the position of the cut portion, thereby defining a bent portion, the bent portion being arranged to press the circuit board downward at the position near the circuit-side connector and to prevent the circuit board from being lifted upward when the circuit-side connector is connected with the mother-board-side connector.

3. A circuit module, comprising:
a circuit board including an electric circuit located on a front surface of the circuit board; and
a shield case arranged to shield the electric circuit of the circuit board by covering the front surface and a side peripheral surface of the circuit board; wherein
the shield case includes:
a frame section vertically arranged on a mother board and covering the side peripheral surface of the circuit board; and
a lid section including a plate member provided at an upper end of the frame section and covering the front surface of the circuit board; wherein
the circuit board is arranged in the frame section at a position spaced apart from a front surface of the mother board;
the circuit board has a circuit-side connector at a back surface of the circuit board, the circuit-side connector being connected with a mother-board-side connector provided at the mother board such that the electric circuit of the circuit board is electrically connected with a conductive portion of the mother board;
the circuit-side connector is provided at a position near one end of the circuit board;
the circuit board has a positioning protrusion arranged to position the circuit board with respect to the frame section, the positioning protrusion protruding outward from an end surface of the circuit board at a position near the circuit-side connector;
the frame section has a positioning hole into which the positioning protrusion is fitted when the circuit board is housed in the frame section;
the frame section has a protrusion protruding upward from the upper end of the frame section at a position above the positioning hole;
the lid section of the shield case has a cut portion arranged to allow a portion of the plate member of the lid section to be bent downward, the cut portion being formed in a portion of the end surface of the lid section covering the circuit-side connector, the portion of the plate member of the lid section is bent downward at the position of the cut portion, thereby defining a bent portion, the bent portion being arranged to press the circuit board downward at the position near the circuit-side connector and to prevent the circuit board from being lifted upward when the circuit-side connector is connected with the mother-board-side connector; and
the lid section has a recess at the position of the bent portion in the portion of the end surface of the lid section, the protrusion at the upper end of the frame section being fitted into the recess, the lid section being arranged at the upper end of the frame section in a correct direction.

* * * * *